United States Patent
Hunt et al.

[11] Patent Number: 6,073,830
[45] Date of Patent: Jun. 13, 2000

[54] SPUTTER TARGET/BACKING PLATE ASSEMBLY AND METHOD OF MAKING SAME

[75] Inventors: Thomas J. Hunt, Peekskill; Paul S. Gilman, Suffern, both of N.Y.

[73] Assignee: Praxair S.T. Technology, Inc., North Haven, Conn.

[21] Appl. No.: 09/172,311

[22] Filed: Oct. 14, 1998

Related U.S. Application Data

[63] Continuation-in-part of application No. 08/426,246, Apr. 21, 1995, Pat. No. 5,836,506.

[51] Int. Cl.⁷ .............. B23K 1/20; B23K 5/213; B23K 20/24; B23K 31/02; B21D 39/00
[52] U.S. Cl. .............. 228/203; 228/164; 228/170; 228/172; 228/174; 228/205
[58] Field of Search ............... 228/162, 170, 228/172, 174, 203, 205, 262.44, 262.5, 262.6, 262.71; 204/298.12, 298.13

[56] References Cited

U.S. PATENT DOCUMENTS

| | | | |
|---|---|---|---|
| 3,186,083 | 6/1965 | Wright, Jr. | 228/205 |
| 4,024,044 | 5/1977 | Brannan et al. | 204/242 |
| 4,349,424 | 9/1982 | Sovey et al. | 204/192 E |
| 5,215,639 | 6/1993 | Boys | 204/192.12 |
| 5,230,459 | 7/1993 | Mueller et al. | 228/164 |
| 5,271,817 | 12/1993 | Bruggae et al. | 204/192.12 |
| 5,282,943 | 2/1994 | Lannutti et al. | 204/192.12 |
| 5,342,496 | 8/1994 | Stellrecht | 204/298.12 |
| 5,354,446 | 10/1994 | Kida et al. | 204/298.22 |
| 5,391,275 | 2/1995 | Mintz | 204/192.32 |
| 5,428,882 | 7/1995 | Makowiecki et al. | 29/527.5 |
| 5,507,931 | 4/1996 | Yang | 204/192.15 |
| 5,593,082 | 1/1997 | Ivanov et al. | 228/122.1 |
| 5,632,869 | 5/1997 | Hurwitt et al. | 204/192.12 |
| 5,653,856 | 8/1997 | Ivanov et al. | 204/192.12 |

FOREIGN PATENT DOCUMENTS

| | | |
|---|---|---|
| 0575166 | 12/1993 | European Pat. Off. . |
| 0590904 | 4/1994 | European Pat. Off. . |
| 3626470 A1 | 2/1988 | Germany . |
| 62-149866 | 12/1987 | Japan . |
| 1-132761 | 8/1989 | Japan . |
| 2-301855 | 2/1990 | Japan . |
| 2-54761 | 2/1990 | Japan . |
| 2-8364 | 3/1990 | Japan . |

OTHER PUBLICATIONS

John G. Banker et al., "*Explosion Welding*", ASM Handbook, vol. 6, Welding, Brazing and Soldering, pp. 303–305 (1993).

*Primary Examiner*—Patrick Ryan
*Assistant Examiner*—Zidia L. Pittman
*Attorney, Agent, or Firm*—Wood, Herron & Evans, L.L.P.

[57] ABSTRACT

This invention is directed to an improved bonded sputter target/backing plate assembly and a method of making these assemblies. The assembly includes a sputter target having side and bottom bonding surfaces bonded within a recess in an underlying backing plate, the recess having top and side bonding surfaces. The method of forming the bonded assembly includes treating the bonding surfaces of either the sputter target or backing plate recess by roughening at least a portion of the bonding surfaces so as to produce a roughened portion having a surface roughness ($R_a$) of at least about 120 micro-inches. The method further includes orienting the sputter target within the backing plate recess to form one assembly having a parallel interface defined by the top and bottom bonding surfaces and a side interface defined by the side bonding surfaces, subjecting the assembly to a controlled atmosphere, heating the assembly, and pressing the assembly so as to bond the bonding surfaces.

23 Claims, 1 Drawing Sheet

SPUTTER TARGET/BACKING PLATE ASSEMBLY AND METHOD OF MAKING SAME

This application is a continuation-in-part of U.S. patent application Ser. No. 08/426,246, filed Apr. 21, 1995 now U.S. Pat. No. 5,836,506, which is incorporated by reference herein.

BACKGROUND OF THE INVENTION

1. Field of the Invention

This invention pertains to bonded sputter target/backing plate assemblies and methods of making such assemblies.

2. Description of the Related Art

Cathodic sputtering is widely used for the deposition of thin layers of material onto desired substrates. Basically, this process requires a gas ion bombardment of a target having a face formed of a desired material that is to be deposited as a thin film or layer on a substrate. Ion bombardment of the target not only causes atoms or molecules of the target materials to be sputtered, but imparts considerable thermal energy to the target. This heat is dissipated beneath or around a backing plate that is positioned in a heat exchange relationship with the target. The target forms a part of a cathode assembly that, together with an anode, is placed in an evacuated chamber filled with an inert gas, preferably argon. A high voltage electrical field is applied across the cathode and the anode. The inert gas is ionized by collision with electrons ejected from the cathode. Positively charged gas ions are attracted to the cathode and, upon impingement with the target surface, these ions dislodge the target material. The dislodged target material traverses the evacuated enclosure and deposits as a thin film on the desired substrate, which is normally located close to the anode.

In addition to the use of an electrical field, increasing sputtering rates have been achieved by the concurrent use of an arch-shaped magnetic field that is superimposed over the electrical field and formed in a closed loop configuration over the surface of the target. These methods are known as magnetron sputtering methods. The arch-shaped magnetic field traps electrons in an annular region adjacent to the target surface, thereby increasing the number of electron-gas atom collisions in the area to produce an increase in the number of positive gas ions in the region that strike the target to dislodge the target material. Accordingly, the target material becomes eroded in a generally annular section of the target face, known as the target raceway.

In a conventional target cathode assembly, the target is attached at a single bonding surface to a nonmagnetic backing plate to form a parallel interface in the assembly, as shown in FIG. 1. The backing plate is normally water-cooled to carry away the heat generated by the ion bombardment of the target. Magnets are typically arranged beneath the backing plate in well-defined positions in order to form the above-noted magnetic field in the form of a loop or tunnel extending around the exposed face of the target.

In order to achieve good thermal and electrical contact between the target and the backing plate, these members are commonly attached to each other by use of soldering, brazing, diffusion bonding, clamping, screwing or epoxy cements.

To a certain extent soft solders can accommodate stresses exerted on the target/backing plate assembly that occur upon cooling. Solder bonds of materials with widely differing thermal expansion rates, however, are susceptible to shear failure initiating at the extreme edges of the bond interface when the solder is too weak for the application. The result commonly experienced is debonding during service. To overcome the problem of joining one or more non-wettable materials by soldering, precoating with a metal is used to enhance solderability. These coatings may be applied by electroplating, sputtering or other conventional means. This need for intermediate coatings applied to target and backing plate materials that are difficult to wet and solder presents problems including adherence reliability of the applied coating and substantial added cost of applying the coating. Furthermore, the relatively low joining temperatures associated with the "soft" solders reduce the temperature range over which the target can be operated during sputtering.

The higher melting temperature solders used for high power applications are stronger but are far less forgiving of the stresses developed in the materials system. Targets of large size present greater stress problems as well as greater difficulty of producing sound bonds across the entire bond surface. As sputtering target sizes and power requirements increase, the soft solders become less applicable for joining of the material systems involved.

Another method which is applicable and used to some extent in target joining is that of explosive bonding or welding. By this technique, bonds are produced that combine solid state bonding and a mechanical interlocking as a result of the surface irregularities produced in the form of "jetting." The bonds are strong and reliable. The disruption of the initial mating surfaces during the dynamic bonding pulse negates the need for extreme surface cleanliness or preparation. See, e.g., John G. Banker et al., "Explosion Welding", ASM Handbook, Vol. 6, *Welding, Brazing and Soldering*; pp. 303–305 (1993).

Explosive bonding is a comparatively costly bonding method. For example, such bonding requires that the materials be provided in an oversized condition to allow for predictable damage at the periphery of the target assembly, thereby adding to material cost. Also, the conditions for achieving acceptable products must be adjusted for different component sizes and combinations of materials, and although the bonds offer good strength, the bond interfaces are variable in physical character. In addition, this method is not applicable to a materials system having one component which is brittle or which has limited ductility.

Smooth-surface diffusion bonding is an applicable method of bonding, but has only limited use in the bonding of sputtering target components. The bond is produced by pressing the material surfaces into intimate contact while applying heat, to induce metallurgical joining and diffusion to a varying extent across the bond interface. Bonding aids, metal combinations which are more readily joined, are sometimes applied to one or both of the surfaces to be bonded. Such coatings may be applied by electroplating, electroless plating, sputtering, vapor deposition or other usable techniques for depositing an adherent metallic film. It is also possible to incorporate a metallic foil between bonding members that has the ability to be more easily bonded to either of the materials to be joined. The surfaces to be joined are prepared by chemical or other means to remove oxides or their chemical films which interfere with bonding.

Smooth surface diffusion bonding requires extreme care in preparation and in maintaining surface cleanliness prior to and during the bonding operation to ensure reliable bond qualities. Because the diffusion bond interfaces are planar, they are subject to stressing in simple shear which commonly leads to peeling away at the ends of the bond area. The formation of brittle intermetallics at the bond interface, which increase in thickness with the associated long times of heat exposure, add to the potential of bond shear failure. An additional technique for bonding as described in U.S. Pat. No. 5,230,459 includes the pre-bonding step of providing machined grooves in the surface of one of the components to be solid-state bonded. This feature causes disruption of the bond surface of the associated component during heated pressure application. The material having the greater strength or hardness will normally be provided with the grooves such that, during bonding, it will penetrate into the softer member with the softer metal substantially filling the grooves.

Groove bonding is applicable to bonding many dissimilar materials, but is limited to materials that have dissimilar melting temperatures because the process must occur near the melting temperature of the lower melting point alloy. This precludes the use of this technique for similar metals. It is also possible that the saw tooth nature of the grooves may act as a stress concentrator and promote premature cracking in the alloys near the bonds. Furthermore, machining of the grooves is a time consuming operation.

In U.S. patent application Ser. No. 08/426,246, hereby incorporated by reference in its entirety, a method is disclosed for performing a surface roughening treatment to the bonding surface of the sputter target and/or backing plate, followed by solid state bonding. This roughening surface treatment provides 100% surface bonding compared to only 99% surface bonding in the absence of the surface treatment. The treatment further provides a bond with over twice the tensile strength of a bond formed from the non-treated smooth surfaces.

Irrespective of which above-described bonding method is used, conventional target cathode assemblies are limited with respect to the thickness of the target material that may be used to comply with the overall standard dimensions of the assembly as used and understood by the industry. The thickness of the target measured perpendicular to its sputter surface, plus the thickness of the backing plate, and the thickness of the backing plate at its periphery, measured in the same direction as that of the target, are set by the industry. Increasing the thickness of the sputter target would make the thickness of the overall assembly too large. Thin targets provide less material for sputtering, and must, therefore, be replaced frequently. Efforts to accomplish greater target thickness without altering the industry accepted dimensions have proved costly and ineffective. For example, the backing plate and target may be a one-piece construction made solely from target material. This allows more target material to be available for sputtering, which decreases the frequency with which the targets must be replaced. The target material, however, is generally expensive. It is thus preferable from a material cost standpoint to provide a two-piece construction with the backing plate made from a less expensive material.

Accordingly, it is an object of the invention to provide a convenient, inexpensive method for bonding thicker targets than have been previously possible to backing plates of either similar or dissimilar material where the bonded assembly is capable of withstanding thermal expansion and contraction stresses exerted thereon during and after sputtering.

SUMMARY OF THE INVENTION

This invention is directed to an improved sputter target/backing plate assembly and a method for making such an assembly. The assembly includes a sputter target having side and bottom bonding surfaces that are bonded to the side and top bonding surfaces of a recess formed in an underlying backing plate. There are thus two bonding interfaces in the assembly of the present invention, a parallel interface and a side interface. The method of forming the bonded assembly includes treating at least one, and preferably both, bonding surfaces of either the target or the backing plate recess by roughening at least a portion of the bonding surfaces so as to produce a roughened portion having a surface roughness ($R_a$) of at least about 120 micro-inches. The method further includes orienting the sputter target within the recess of the backing plate, subjecting the assembly to a controlled atmosphere, heating the assembly, and pressing the assembly so as to bond the bonding surfaces, thereby forming a bonded parallel interface and a bonded side interface.

The surface roughening is preferably accomplished by particle blasting, shot peening, etching or a combination thereof. The roughening step preferably includes roughening substantially the entire bonding surfaces of at least one of the sputter target and backing plate. In a preferred form of the invention, the roughening step includes roughening at least a portion of each of the two bonding surfaces of the sputter target, and in a more preferred form, substantially all of each of the two target bonding surfaces are roughened.

Although the roughened portion should have a surface roughness of at least 120 micro-inches, the surface roughness preferably ranges from about 120 micro-inches to about 150 micro-inches, and more preferably is about 135 micro-inches after the roughening step.

The controlled atmosphere used in forming the bonded sputter target/backing plate assembly preferably is a vacuum, inert gas, reducing gas, or combination thereof.

Any of a number of different materials may be used for the sputter target and backing plate. Preferably, the sputter target is made of titanium, aluminum, molybdenum, cobalt, chromium, ruthenium, rhodium, palladium, silver, osmium, iridium, platinum, gold, tungsten, silicon, tantalum, vanadium, nickel, iron, manganese or germanium, or an alloy thereof. The backing plate preferably is made of aluminum, copper, steel, or titanium, or an alloy thereof.

In the heating step, the assembly typically is heated to a temperature somewhat below the homologous melting point of the metal used for the backing plate. More specifically, when the backing plate is aluminum or an aluminum alloy, the assembly preferably is heated to a temperature of from about 300° C. to about 575° C., and when copper or a copper alloy is used, the assembly is heated to a temperature of from about 540° C. to about 1015° C. If the backing plate is made of steel, the temperature in the heating step should range from about 730° C. to about 1320° C., while if titanium or a titanium alloy is used, the temperature should be from about 890° to about 1570° C.

In the pressing step, the assembly preferably is pressed at a pressure of from about 30 MPa to about 140 MPa. This pressure is advantageously held for a period of about 30 minutes to about 90 minutes, and preferably for about 60 minutes.

The benefits of sputter target/backing plate assemblies of the present invention are a thicker target that reduces the frequency with which the target needs to be replaced, and a backing plate made from a relatively inexpensive material. The overall assembly meets the objectives of low cost and thick target material without changing the industry-accepted dimensions. Additionally, the sputter target/backing plate assemblies of the present invention have improved strength and resistance to shear failure, due to both the presence of two bonding interfaces instead of one, and to the surface treatment of each of the bonding surfaces. The treatment of the bonding surfaces and the recessed backing plates, together with solid-state bonding of the interfaces, provides a target/backing plate assembly in which the target is embedded in the material of the backing plate, forming an integral assembly. The enhanced strength and resistance to bond failure allows such assemblies to be used at higher operational sputtering temperatures and extends the range of target sizes that may be used without compromising structural reliability.

Furthermore, the methods used for treating the bonding surface, such as particle blasting, shot peening, etching, or a combination thereof, result in manufacturing time-savings and cost savings when compared with the extensive surface preparation required for smooth surface diffusion bonding or for groove bonding. In addition, several prior art methods require lengthy exposure of an assembly to temperatures which can deleteriously alter the microstructure of the target, thereby degrading the target's performance. However, the temperatures used in the present method allow the solid-state bond to be formed while minimizing excessive exposure to high temperatures.

These and other benefits and advantages will become apparent to those of ordinary skill in the art upon a review of the following Figures, Detailed Description of the Drawings, and representative Examples.

DETAILED DESCRIPTION OF THE DRAWINGS

Figure 1:
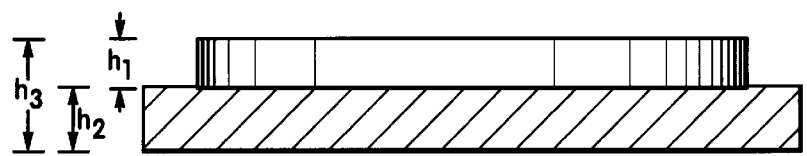
FIG. 1 is a cross-sectional view of a sputter target/backing plate assembly of the prior art.
Figure 2:
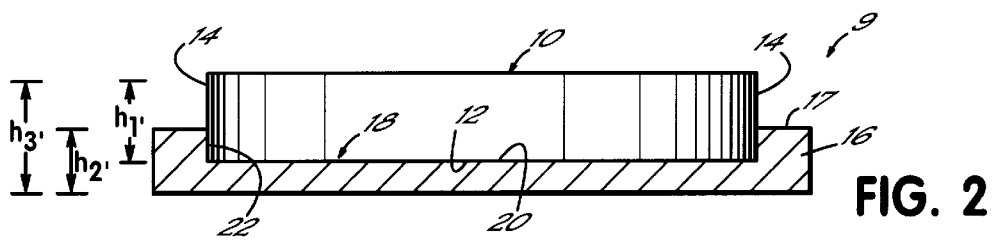
FIG. 2 is a cross-sectional view of a sputter target embedded within a recess formed in a backing plate, according to the principles of the present invention.
Figure 3:
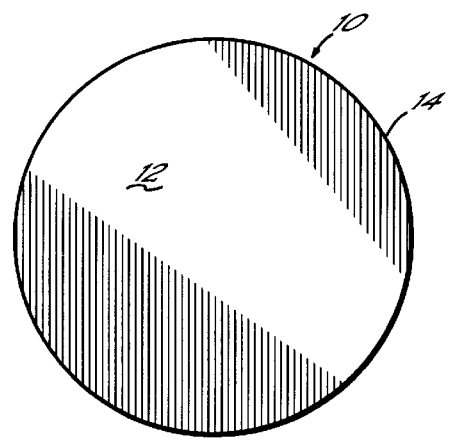
FIG. 3 is a top view of the bottom bonding surface of a sputter target prior to surface roughening.

Referring to FIG. 2, a target/backing plate assembly 9 of the present invention is shown having a backing plate 16 with a recess 18 machined therein and a thick target 10 inlaid in the recess 18. The sputter target 10 has a thickness $h_1'$ greater than the thickness $h_1$ of the prior art sputter targets. Current thicknesses for sputter targets range from about 0.1 inch to about 0.5 inch. The present invention is capable of increasing the thickness of any standard target used in the industry by up to two times the original thickness. The overall height $h_3'$ of assembly 9 and the height $h_2'$ of the backing plate at the periphery 17 (the mounting flange) of assembly 9 is, however, the same as the corresponding heights $h_3$ and $h_2$ of the prior art assembly. The values of $h_2$ and $h_3$ will vary from application to application, but for a particular application, they must remain constant. Thus, FIGS. 1 and 2 illustrate that the target/backing plate assembly of the present invention maintains the industry accepted dimension for $h_2$ and $h_3$, while providing a thicker target than that used in conventional assemblies.

Referring to FIGS. 2 through 7, in a preferred form of the invention, a sputter target 10 is provided having a machined bottom bonding surface 12 that is typically, although not necessarily, parallel to the top surface to be bombarded during the sputtering process, and at least one side bonding surface 14. The side bonding surface 14 has a length equal to the thickness of the target, which may be in the range of about 0.2 inch to about 1.0 inch. The sputter target 10 is prepared for bonding to a backing plate 16 having a recess 18, preferably corresponding to the shape of the target 10, the recess having a top bonding surface 20 substantially corresponding to the bottom bonding surface 12 of the target 10, and a side bonding surface 22 substantially corresponding to the side bonding surface 14 of the target 10. Although the bottom surface 12 of the target 10 may be flat, wavy or conical, for example, it will hereafter be assumed for ease of discussion that the surface 12 is flat and parallel to the top sputtering surface. Thus, the interface to be formed between the top surface 20 of the recess and bottom surface 12 of target 10 will be a parallel interface with respect to the target and sputter surface.

The preparation for bonding consists of roughening the bonding surfaces 12 and/or 14 of the target 10 or the bonding surfaces 20 and/or 22 of the backing plate recess 18. The number of side bonding surfaces is dependent on the shape of the target. For example, if the target has a stepped diameter, its external side surface would have concentric, axially spaced cylindrical side surfaces of differing diameters corresponding to the differing diameters of the stepped diameter target, with a radially disposed shoulder separating the different diameter axially spaced target sections. For the purpose of ease of discussion, this disclosure will hereafter refer to a single cylindrical side surface, as with a disc-shaped target of uniform diameter. Although a disc-shaped target is preferred, it is to be understood that other shaped targets, such as oval, square or rectangular, may be used. The roughened bonding surfaces 12', 14' as shown FIGS. 5 and 6A or 20', 22' as shown in FIG. 6B may be formed by any of a number of techniques, including for example, particle blasting, shot peening, etching, or a combination thereof. Particle blasting with grit is a preferred method because the equipment generally is readily available and easy to use, and this method produces a more uniformly roughened surface.

Figure 4:
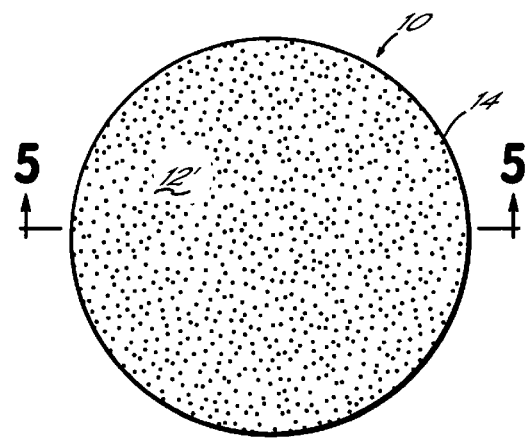
FIG. 4 is a top view of the sputter target of FIG. 3 after surface roughening.
Figure 5:
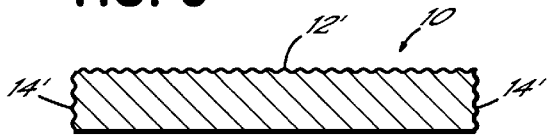
FIG. 5 is a cross-sectional view of the sputter target of FIG. 4 taken along line 5—5.
Figure 6A:
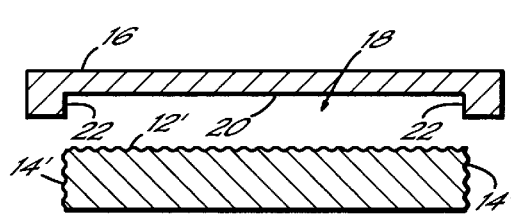
FIG. 6A is an exploded cross-sectional view of an unbonded assembly showing the roughened sputter target of FIG. 5 and a corresponding unroughened recessed backing plate disposed above.
Figure 6B:
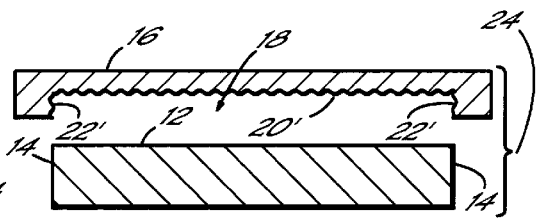
FIG. 6B is an exploded cross-sectional view of an unbonded assembly showing a roughened backing plate recess disposed above a corresponding unroughened sputter target.

As shown in FIGS. 4 and 5, the roughening treatment is preferably applied substantially to the entire bonding surfaces 12, 14. However, if desired, the roughening treatment may be applied only to a particular portion or portions of the bonding surfaces. Furthermore, referring to FIG. 6A, in a preferred form of the invention, only the bonding surfaces 12, 14 of the sputter target 10 receive the roughening treatment to create roughened bonding surfaces 12', 14', while the bonding surfaces 20, 22 of the backing plate recess 18 remain unroughened. Referring to FIG. 6B, if desired, the invention may be practiced by roughening at least a portion of the bonding surfaces 20, 22 of the backing plate recess to create roughened bonding surfaces 20', 22' in lieu of roughening the sputter target 10. Alternatively, the roughening treatment may include roughening at least a portion of both the sputter target and backing plate bonding surfaces. The roughening treatment may also be limited to roughening only the side bonding surface of either the target or backing plate recess, preferably the side surface of the target.

In practicing the invention, the particular surfaces to be roughened should be treated so as to have a surface roughness ($R_a$) of at least about 120 micro-inches. As used herein, the term "surface roughness" ($R_a$) is defined as the arithmetic average deviation of the surface expressed in micro-inches from a mean line or center line, with $R_a$ being the nationally adopted symbol for surface roughness. Preferably, this surface roughness should be from about 120 micro-inches to about 150 micro-inches, and more preferably is about 135 micro-inches after the roughening step. As seen in FIGS. 5, 6A and 6B, the roughening step produces an uneven surface topography on the bonding surfaces treated.

In a preferred method of forming the bonded assembly, the roughened portions are cleaned prior to bonding to remove any particles which may remain after grit blasting, shot peening or etching. Any of a number of different methods may be used to remove the particles, and since this is not a degreasing step, a dry lint-free wipe may be used. If desired, the bonding surfaces of the unroughened component of the assembly (typically the backing plate when the sputter target is roughened) may be cleaned with an acetone wipe or other degreasing composition, such as isopropyl alcohol or soap and water, to remove machining oils, fingerprints and the like.

Once the bonding surfaces have been pre-treated by surface roughening, the sputter target may be bonded into the backing plate using a known technique, such as hot isostatic pressing (HIP). It is to be understood, however, that other suitable methods of bonding known to one skilled in the art may be utilized in the present invention.

Figure 7A:
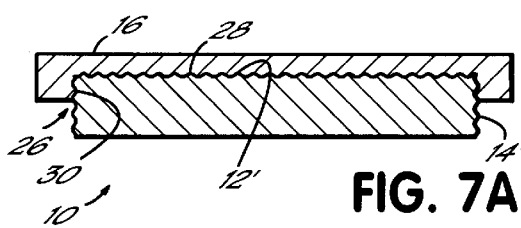
FIG. 7A is a cross-sectional view of a bonded sputter target/backing plate assembly of the present invention made from the sputter target and backing plate of FIG. 6A.
Figure 7B:
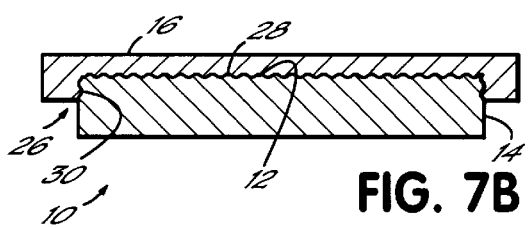
FIG. 7B is a cross-sectional view of a bonded sputter target/backing plate assembly of the present invention is made from the sputter target and backing plate of FIG. 6B.

In a preferred embodiment of the present invention, the assembly is bonded using hot isostatic pressing (HIP). Referring to FIGS. 6A and 7A as an example, the treated sputter target 10 and backing plate 16 are oriented to form an assembly 24 having a parallel interface and a side interface defined by the bonding surfaces 12', 20 and 14', 22, respectively, and this assembly is placed within a HIP canister. Any canister may be used as long as it is deformable and is able to withstand HIP conditions. Typically, a steel can having a side wall, bottom plate, top plate and sealable opening for pulling a vacuum is used. Once the assembly is placed in the HIP canister, a vacuum is pulled, typically on the order of $10^{-2}$ torr or greater. Other controlled atmospheres may be used, such as reducing gas or inert gas, or a combination of these atmospheres may be used. This canister then is placed within a HIP chamber that is adapted to withstand severe temperature and pressure conditions. The ambient atmosphere in the HIP chamber is replaced with an inert gas, such as argon or helium. In addition to adjusting the atmosphere, the temperature in the HIP chamber is increased in order to heat the unbonded assembly. Referring to Table 1, the assembly is heated to a temperature somewhat below the homologous melting point ($T_m$) of the metal used for the backing plate. Preferably, the assembly is heated to a temperature in the range of from about 0.60 $T_m$ to about 0.95 $T_m$, and more preferably, within the range of about 0.75 $T_m$ to about 0.90 $T_m$.

These temperature ranges are shown in Table 1 for various metals typically used as the backing plate material. By elevating the temperature of the assembly to a temperature somewhat below the melting point of the backing plate material, the backing plate softens, and upon pressing, forms tight interfaces with the treated bonding surfaces of the sputter target.

TABLE 1

| Backing Plate | TEMPERATURE VALUES AS A FRACTION OF THE HOMOLOGOUS MELTING POINT $T_m$ | | | |
|---|---|---|---|---|
| Material | 0.6 $T_m$ | 0.75 $T_m$ | 0.9 $T_m$ | 0.95 $T_m$ |
| Cu | 815° K. | 1015° K. | 1220° K. | 1288° K. |
|  | 542° C. | 742° C. | 947° C. | 1015° C. |
| Steel | 1005° K. | 1255° K. | 1505° K. | 1590° K. |
|  | 732° C. | 982° C. | 1232° C. | 1317° C. |
| Ti | 1165° K. | 1455° K. | 1745° K. | 1844° K. |
|  | 892° C. | 1182° C. | 1472° C. | 1571° C. |
| Al | 573° K. | 723° K. | 823° K. | 848° K. |
|  | 300° C. | 450° C. | 550° C. | 575° C. |

Furthermore, with respect to pressure, the HIP canister and assembly contained therein are compressed from all sides at a pressure of from about 30 MPa to about 140 MPa. The assembly is maintained at the desired temperature, pressure and inert atmospheric conditions for a period of about 30 minutes to about 90 minutes, and preferably for a period of about 60 minutes. When metals having different coefficients of expansion are used for the sputter target and backing plate, it is advantageous to remove a portion of the increased pressure from the HIP chamber while maintaining an elevated temperature, thereby reducing the risk of bond cracking due to tensile stresses. The amount of increased pressure to be removed will depend on the specific metals being used.

As shown in FIG. 7A, when the roughened sputter target 10 and backing plate 16 are bonded together to form a bonded assembly 26, the roughened bonding surfaces 12', 14' of the sputter target 10 slightly compress and deform the bonding surfaces 20, 22 of the softer backing plate 16 thereby creating tight bond interfaces 28, 30.

Although the above discussion referred to the preferred embodiment in which both the side and bottom bonding surfaces of the sputter target were treated by roughening, it is to be understood that the present invention further encompasses the treatment of the bonding surfaces of the backing plate recess, instead, or the treatment of only the side bonding surface of either the sputter target or backing plate.

The metals used for the sputter target and backing plate may be any of a number of different metals, either in pure or alloy form. For example, the sputter target may be made of titanium, aluminum, molybdenum, cobalt, chromium, ruthenium, rhodium, palladium, silver, osmium, iridium, platinum, gold, tungsten, silicon, tantalum, vanadium, nickel, iron, manganese, germanium, or an alloy thereof. In addition, the backing plate may be made of aluminum, copper, steel, titanium, or an alloy thereof. Preferred sputter target/backing plate metal pairings include a titanium-tungsten target bonded to an aluminum backing plate, a titanium-tungsten target bonded to a titanium backing plate, a titanium target bonded to an aluminum backing plate, an aluminum target bonded to an aluminum backing plate, a titanium target bonded to a titanium backing plate, a molybdenum target bonded to a copper backing plate, a cobalt target bonded to a copper backing plate, a chromium target bonded to a copper backing plate, and a target formed of a precious metal such as ruthenium, rhodium, palladium, silver, osmium, iridium, platinum or gold, bonded to a copper backing plate. If a titanium-tungsten alloy is used, the alloy preferably includes about 10% to 15% titanium by weight.

Although the method has been described in conjunction with a disc-shaped sputter target/backing plate assembly, it will be readily apparent to one of ordinary skill that the method may be used to bond sputter targets and backing plates having any of a number of different shapes and sizes.

EXAMPLES

Example 1
The Formation of Bonded Sputter Target/Backing Plate Assemblies

Several circular disc-shaped target/backing plate assemblies were produced using pure titanium for the targets and 6061 aluminum for the backing plates. This particular example produced an assembly having a backing plate thickness $h_2'$ of 0.43 inch at the mounting flange portion or periphery 17 and an overall thickness $h_3'$ of 0.7 inch. It is to be understood, however, that these values are only one example of acceptable industry dimensions for target/backing plate assemblies. This invention is in no way limited to the values used in this illustrative example.

Each disc-shaped target blank measured 13.2 inches×0.55 inch, while each circular disc-shaped backing plate blank measured 16.9 inches×1.0 inch. A disc-shaped recess was machined in the top surface of the backing plate blank, the recess measuring 13.21 inches×0.55 inch+/−0.01 inch. The bonding surfaces of each of the titanium targets were machined flat, and then several of the targets were given a roughening surface treatment. The sputter targets were grit-blasted using the following procedure. Each target was placed in a grit blast cabinet, and the air pressure on the grit blast machine was set to 60 psi. Then, using grit No. 46, the bonding surfaces of the target were grit-blasted by holding the grit blast nozzle at a 45° angle approximately 1.5 inches to 2 inches from the bonding surfaces. The grit blasting was continued in a sweeping motion until all target bonding surfaces had a rough gray surface. Then, compressed air was used to blow any loose particles off the target and the target bonding surface was cleaned with alcohol. Those targets that did not receive a roughening treatment have smooth bonding surfaces as a result of the machining.

Each of the titanium targets was then paired with a 6061 aluminum recessed backing plate and loaded into an evacuated steel hot isostatic press can. Each can was then hot isostatically pressed (HIPed) in order to form a bonded assembly. Once a press can containing an assembly was loaded into the HIP control chamber, the chamber was filled with argon and the temperature and pressure increased to a temperature of about 900° F. and a pressure of about 6000 psi. The sputter target/backing plate assembly was maintained under these conditions for about 60 minutes, at which point the pressure was reduced quickly from 6000 psi to about 5000 psi, which cooled the assembly somewhat. Then, the assembly was cooled to ambient temperature by reducing the temperature by approximately 120° F. every hour. In addition, the pressure in the HIP chamber was returned to ambient pressure over that same time period. Each of the target/backing plate assemblies discussed above in Example 1 were hot isostatically pressed using the same process.

Each bonded assembly was then machined to conform to industry accepted dimensions, as follows. The non-recessed, bottom surface of the backing plate was machined down until the backing plate thickness measured about 0.70 inch at periphery 17. Because the target blank has a thickness $h_1'$ approximately equal to the depth of the recess (0.55 inch), the assembly has, at this point an overall thickness $h_3'$ of backing plate plus target of 0.7 inch. The top surface of the backing plate at periphery 17 surrounding the recessed sputter target, also referred to as the mounting flange, was then machined down until the thickness $h_2'$ measured 0.430 inch. The resulting assembly is that most clearly shown in FIG. 2, having a backing plate and target thickness $h_3'$ of 0.7 inch, a backing plate thickness $h_2'$ at the periphery of 0.43 inch, and a target thickness $h^{1}{}'$ of approximately 0.55 inch, of which 0.12 inch extends above the periphery of the backing plate.

Example 2
Measurement of Bond Integrity

The bond integrity of each of the titanium/aluminum assemblies formed in Example 1 was measured by ultrasonic techniques to determine the percentage of the bond surfaces actually bonded. Two samples each were tested for the roughened surface and the non-roughened or smooth surface, with averaged ultrasonic results given in Table 2 for both the side interface and the parallel interface.

TABLE 2

| Surface Preparation | % Surface Bonded: Parallel Interface | % Surface Bonded: Side Interface |
|---|---|---|
| Smooth Surface | 99 | 0 |
| Grit-blasted | 100 | 100 |

The grit-blasted assemblies showed 100% bonding at both interfaces while the smooth surface assembly was approximately 99% bonded at the parallel interface with no bonding at the side interface. Although not tested, it is expected that an assembly with smooth parallel bonding surfaces and at least one roughened side bonding surface would result in an assembly with 100% surface bonding at the side interface and 99% surface bonding at the parallel interface.

Example 3
Tensile Strength of the Bonds

The loaded assemblies formed in Example 1 were sectioned into bars 101.6 mm long by 25.4 mm wide. Then, a hole was drilled through each bar near one end, perpendicular to the parallel bond interface, and a 25.4 mm deep saw cut was made from that same end, along the plane of the parallel bond interface to prepare for tensile testing. The same procedure was conducted for the side bond interface. Tensile tests then were run using an Instron Universal Testing Machine Model TTC. The samples were pulled in tension with the direction of applied stress perpendicular to the bond. Two samples were tested for each surface preparation type and for each bond interface, and the average of the two tensile test results for each bond are given in Table 3.

TABLE 3

| Surface Preparation | Tensile Strength at Failure of Parallel Bond | Tensile Strength at Failure of Side Bond |
|---|---|---|
| Smooth Surface | 748 psi | 0 psi |
| Grit-blasted | 1790 psi | 5700 psi |

The tensile strength for the grit-blasted parallel interface was actually measured at the time of fracture of the Al backing plate. The parallel bond proved stronger than the backing plate itself, and so no bond separation actually occurred. The grit-blasted side bond interface displayed a very high tensile strength at failure, while the smooth side interface displayed no bond and therefore no tensile strength.

The preferred embodiments and examples discussed above are provided by way of illustration only and are not intended to limit the scope of the invention, which is to be determined by the following claims.

What is claimed is:

1. A method of forming a bonded sputter target/backing plate assembly, comprising the steps of:
   providing a sputter target having at least one side bonding surface and a bottom bonding surface;
   providing a backing plate having a recess therein which includes at least one side bonding surface and a top bonding surface;
   treating at least the side bonding surface of at least one of the sputter target and backing plate recess by roughening at least a portion of the side bonding surface so as to produce a roughened portion having a surface roughness ($R_a$) of at least about 120 micro-inches;
   orienting the sputter target within the recess of the backing plate;
   subjecting the assembly to a controlled atmosphere;
   heating the assembly; and
   pressing the assembly so as to bond the bottom bonding surface of the sputter target to the top bonding surface of the backing plate recess and the side bonding surface of the sputter target to the side bonding surface of the backing plate recess.

2. The method of claim 1, wherein the recess has a shape substantially corresponding to the shape of the sputter target.

3. The method of claim 1, wherein the treating step includes roughening the side bonding surface of the sputter target.

4. The method of claim 1, wherein the treating step includes roughening the side bonding surface of the backing plate recess.

5. The method of claim 1, wherein the treating step includes roughening the side bonding surface of both the sputter target and the backing plate recess.

6. The method of claim 1, wherein the roughened portion has a surface roughness ($R_a$) of from about 120 micro-inches to about 150 micro-inches after the treating step.

7. The method of claim 6, wherein the roughened portion has a surface roughness ($R_a$) of about 135 micro-inches after the treating step.

8. The method of claim 1, wherein the bonding surfaces are roughened by a technique selected from the group consisting of particle blasting, shot peening and etching, and combinations thereof.

9. The method of claim 1, wherein the controlled atmosphere is selected from the group consisting of a vacuum, inert gas, reducing gas and combinations thereof.

10. The method of claim 1, wherein the sputter target is made of a metal selected from the group consisting of titanium, aluminum, molybdenum, cobalt, chromium, ruthenium, rhodium, palladium, silver, osmium, iridium, platinum, gold, tungsten, silicon, tantalum, vanadium, nickel, iron, manganese, germanium, and alloys thereof.

11. The method of claim 1, wherein the backing plate is made of a metal selected from the group consisting of aluminum, copper, steel, titanium, and alloys thereof.

12. The method of claim 11, wherein the backing plate is made of aluminum or an aluminum alloy and the heating step includes heating the assembly to a temperature of from about 300° C. to about 575° C.

13. The method of claim 11, wherein the backing plate is made of copper or a copper alloy and the heating step includes heating the assembly to a temperature of from about 540° C. to about 1015° C.

14. The method of claim 11, wherein the backing plate is made of steel and the heating step includes heating the assembly to a temperature of from about 730° C. to about 1320° C.

15. The method of claim 11, wherein the backing plate is made of titanium or a titanium alloy and the heating step includes heating the assembly to a temperature of from about 890° C. to about 1570° C.

16. The method of claim 1, wherein the pressing step includes pressing the assembly at a pressure of from about 30 MPa to about 140 Mpa.

17. The method of claim 16, wherein the pressing step is performed for about 30 minutes to about 90 minutes.

18. The method of claim 17, wherein the pressing step is performed for about 60 minutes.

19. A method of forming a bonded sputter target/backing plate assembly, comprising the steps of:
   providing a sputter target having at least one side bonding surface and a bottom bonding surface;
   providing a backing plate having a recess therein which includes at least one side bonding surface and a top bonding surface;
   treating each of the bonding surfaces of at least one of the sputter target and backing plate recess by roughening at least a portion of each of the bonding surfaces so as to produce a roughened portion having a surface roughness ($R_a$) of at least about 120 micro-inches;
   orienting the sputter target within the recess of the backing plate;
   subjecting the assembly to a controlled atmosphere;
   heating the assembly; and
   pressing the assembly so as to bond the bottom bonding surface of the sputter target to the top bonding surface of the backing plate recess and the side bonding surface of the sputter target to the side bonding surface of the backing plate recess.

20. The method of claim 19, wherein the recess has a shape substantially corresponding to the shape of the sputter target.

21. The method of claim 19, wherein the treating step includes roughening substantially the entire bonding surfaces of at least one of the sputter target and backing plate recess.

22. The method of claim 19, wherein the treating step includes roughening the side and bottom bonding surfaces of the sputter target.

23. The method of claim 19, wherein the treating step includes roughening the side and top bonding surfaces of the backing plate recess.

* * * * *